United States Patent
Ogasawara et al.

(10) Patent No.: US 9,207,260 B2
(45) Date of Patent: Dec. 8, 2015

(54) PROBE BLOCK, PROBE CARD AND PROBE APPARATUS BOTH HAVING THE PROBE BLOCK

(71) Applicant: KABUSHIKI KAISHA NIHON MICRONICS, Tokyo (JP)

(72) Inventors: Takashi Ogasawara, Tokyo (JP); Norie Yamaguchi, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 180 days.

(21) Appl. No.: 13/671,040

(22) Filed: Nov. 7, 2012

(65) Prior Publication Data

US 2013/0113512 A1    May 9, 2013

(30) Foreign Application Priority Data

Nov. 7, 2011   (JP) .................................. 2011-243826

(51) Int. Cl.
   *G01R 1/067*   (2006.01)
(52) U.S. Cl.
   CPC .................................. *G01R 1/06772* (2013.01)
(58) Field of Classification Search
   CPC ...... G01R 1/67; G01R 31/26; G01R 1/06772; G01R 1/067; G01R 1/073; G01R 1/07371; G01R 1/06722; G01R 1/06738; G01R 31/31905; G01R 31/2882; G01R 31/2889
   USPC ............. 324/754, 755, 757, 72.5, 538, 158.1, 324/73, 755.11, 755.01, 756.03, 750.26, 324/754.07; 439/850, 638, 695, 482, 697, 439/692, 66, 607.01; 29/874
   See application file for complete search history.

(56) References Cited

U.S. PATENT DOCUMENTS

| | | | | |
|---|---|---|---|---|
| 3,870,951 A | * | 3/1975 | Brown et al. | ................. 324/689 |
| 4,523,144 A | * | 6/1985 | Okubo et al. | ............ 324/750.25 |
| 5,160,273 A | * | 11/1992 | Carney | ........................... 439/108 |
| 5,486,770 A | | 1/1996 | Johnson | |
| 5,884,395 A | * | 3/1999 | Dabrowiecki et al. | .......... 29/825 |
| 5,969,533 A | * | 10/1999 | Takagi | ..................... 324/754.07 |
| 6,420,889 B1 | * | 7/2002 | Terada | ..................... 324/750.27 |
| 7,791,364 B2 | * | 9/2010 | Narita et al. | ............. 324/755.11 |
| 8,466,704 B1 | * | 6/2013 | Aflaki Beni et al. | ..... 324/755.11 |
| 2001/0054510 A1 | | 12/2001 | Yoshida et al. | |
| 2005/0164560 A1 | * | 7/2005 | Carroll | .......................... 439/638 |
| 2007/0024302 A1 | * | 2/2007 | Tervo et al. | .................. 324/754 |

(Continued)

FOREIGN PATENT DOCUMENTS

| | | |
|---|---|---|
| CN | 1330401 A | 1/2002 |
| EP | 2239587 A1 | 10/2010 |
| JP | 2765247 | 9/1992 |

(Continued)

*Primary Examiner* — Tung X Nguyen
*Assistant Examiner* — Thang Le
(74) *Attorney, Agent, or Firm* — Browdy and Neimark, PLLC (57) ABSTRACT

The present invention provides a probe block, which comprises 1) a conductive base on which a first groove is formed, 2) a pair of signal transmitting probes which have dielectric covers and are placed parallel to each other in the first groove, and 3) a ground probe which is in contact with the conductive base, wherein front portions of the signal transmitting probes and the ground probe protrude from the conductive base to form signal transmitting probe needles and a ground probe needle, respectively. The probe block of the present invention has excellent high frequency responses characteristics and is easy for maintenance.

14 Claims, 11 Drawing Sheets

(56) References Cited

U.S. PATENT DOCUMENTS

2008/0007278 A1* 1/2008 Ku et al. .................. 324/754
2011/0100682 A1* 5/2011 Nonen et al. ................ 174/254

FOREIGN PATENT DOCUMENTS

| | | |
|---|---|---|
| JP | 1993-352150 | 12/1999 |
| JP | 2001-153885 | 6/2001 |
| JP | 2011-196821 A | 10/2001 |
| JP | 2005-043281 | 2/2005 |
| JP | 2005149854 A | 6/2005 |
| JP | 2008-045950 | 2/2008 |
| JP | 2008-205282 | 9/2008 |
| TW | 201224461 A | 6/2012 |
| WO | 2010/148157 A1 | 12/2010 |

* cited by examiner

PROBE BLOCK, PROBE CARD AND PROBE APPARATUS BOTH HAVING THE PROBE BLOCK

BACKGROUND OF THE INVENTION

1. Field of the Invention

The present invention relates to a probe block, in particular a probe block suitable for transmitting balanced signal, and a probe card and a probe apparatus both having said probe block.

2. Description of the Related Art

In recent years, with improvements in performance of semiconductor devices, it is desired to improve frequency response characteristics of inspecting apparatus which inspects electrical properties of semiconductor devices. Japanese Patent No. 2765247, for example, discloses a probe card, in which at least one probe needle is covered with dielectric film except its tip portion, and the surface of the dielectric film and conductive surfaces of other probe needles are covered with conductive substance to electrically connect them, thereby decreasing parasitic capacitance between probe needles and improving isolation between probe needles. In the probe card, however, since the probe needles are covered with the conductive substance up to the portion very close to the tip of probe needles, a movement of one probe needle affects on other probe needles. Therefore, the probe card has disadvantages that each of the probe needles is not so flexible enough to contact sufficiently with a bonding pad of semiconductor device under test. In addition, it is not so easy to assemble the probe card, because more than one probe needles have to be collected and fixed with conductive substance. On the same reasons, the maintenance of the probe card, such as exchange of probe needles, is difficult.

The Japanese Patent Kokai No. 2008-45950 (JP 2008-45950 A) discloses a probe card which uses high frequency pulse wave for inspection. The probe card basically employs coaxial structure. However, the probe card employs parallel two-wire lines structure in tip portion of the probes, because it is hard to employ coaxial structure there. The probe card thereby attempts to decrease incompleteness of impedance matching with 50 ohm. In the probe card, however, it is necessary to electrically connect a grand probe with an outside conductor of the coaxial structure. For this reason, it is not easy to assemble the probe card. In addition, satisfying high-frequency response characteristics are not achieved in the probe card, because the ground probe is different from the signal transmitting probes in its height and in its length. Furthermore, the portions having parallel two-wire structure need be fixed and supported with resin in one body at their center positions. Because of this, there are disadvantages in the probe card that installation and removal of the probes are not so easy.

The Japanese Patent Kokai No. 2008-205282 (JP 2008-205282 A) discloses a probe card, in which, among more than one probe needles, at least one of probe needles which input and output high speed signal is covered with dielectric having relative dielectric constant larger than that of air, thereby trying to relax quality control level in terms of dimensional tolerance among probe needles in high speed balanced interface. In the probe card, however, probe needles are covered with dielectric only in their parts between electrodes in circuit board of probe card and fixed positions near to the tips. Therefore, it is difficult to keep constant the space between two probe needles which form balanced transmission line, and consequently there are drawbacks in the probe card that noise is not decreased sufficiently.

The present invention has been made to overcome the drawbacks of the conventional technique as above mentioned. The aim of the present invention is to provide probes for transmitting balanced signals having superior high frequency response characteristics and being easy to be maintained. Another aim of the present invention is to provide a probe card and a probe apparatus both having said probes.

SUMMARY OF THE INVENTION

After having diligently studied to attain the aims, the present inventors have found that it is possible to obtain probes for transmitting balanced signals in which excellent high frequency response characteristics and easiness in maintenance coexist, when a groove for positioning is formed on a conductive base to place a pair of probes. The probes making the pair have dielectric covers and are placed parallel to each other in the groove with their dielectric covers being contact with each other to form a probe block putting together all of them.

That is to say, the present invention attain the aims as above mentioned by providing a probe block, which comprises 1) a conductive base on which a first groove is formed, 2) a pair of signal transmitting probes having dielectric covers and placed parallel to each other in the first groove with their dielectric covers being contact with each other, and 3) a ground probe which is in contact with the conductive base, wherein front portions of the signal transmitting probes are bare of the dielectric covers and protrude from the conductive base toward a device under test to form signal transmitting probe needles, and a front portion of the ground probe protrudes from the conductive base toward the device under test to form a ground probe needle.

In the probe block of the present invention, as mentioned above, the two signal transmitting probes which make a pair have dielectric covers and are placed in the first groove formed on the conductive base parallel to each other and with their dielectric covers being contact with each other. Therefore, a balanced transmission line is formed by the pair of the signal transmitting probes. In particular, since the two signal transmitting probes making a pair are placed and exactly positioned in the first groove parallel to each other and being contact with each other, the characteristic impedance between balanced signals is kept constant in the probe block and an idealistic coupling state can be maintained. Consequently, it is possible to transmit high speed signals more accurately, when the characteristic impedance of each of the signal transmitting probes is set to match with the characteristic impedance of a device under test. Further, since a pair of the signal transmitting probes and a ground probe form a probe block in association with the conductive base, one or more probe needles can be exchanged, when it is needed, with new ones by the probe block. Therefore, the maintenance of the probe needles becomes very easy when the probe block of the present invention is employed.

In preferable embodiment, the probe block of the present invention has a conductive cover plate which covers the upper surfaces of the pair of the signal transmitting probes placed in the first groove. When the probe block of the present invention has the conductive cover plate, the pair of the signal transmitting probes which form a balanced transmission line is shielded more perfectly by the conductive cover plate together with the conductive base.

In the probe block of the present invention, it is preferable to form a second groove and place the ground probe in the second groove. In a preferable embodiment, the depth of the first groove is greater than that of the second groove, and the signal transmitting probes and the ground probe are same in the height of their centers in a cross section vertical to longitudinal direction of the conductive base from the base plane of the conductive base at least at the front end of the conductive base near to the device under test, and also in the length of the front portions which protrude from the conductive base toward the device under test. When the signal transmitting probes and the ground probe are placed in the first and the second grooves formed on the conductive base, respectively, it is easy to make the signal transmitting probes and the ground probe to be same in the length of the front portions which protrude from the conductive base toward a device under test. Consequently, high frequency response characteristics of the probe block of the present invention can be further improved.

In another preferable embodiment, the probe block of the present invention has more than one first grooves formed on the conductive base. In each of the first grooves, the two signal transmitting probes which make a pair are placed parallel to each other, with their dielectric covers being contact with each other. More than one pairs of the signal transmitting probes are separated one another by the conductive base and/or the conductive cover plate. In other words, the conductive base and/or the conductive cover plate both connected to the ground potential lie between the pairs which form balanced transmission lines. Consequently, isolations between the balanced pairs are maintained in good state, which is a preferable advantage.

The probe block of the present invention can be adapted to a device to be tested having a bonding pad pitch different from the pitch of the signal transmitting probes and the ground probes existing inside of the conductive base, by bending the front portions of the signal transmitting probes and the ground probes, which protrude from the conductive base toward a device under test, with respect to the portions of the signal transmitting probes and the ground probes existing inside of the conductive base.

Furthermore, the present invention attains the above mentioned aim by providing a probe card, which has one or more probe blocks of the present invention. In addition, the present invention attains the above mentioned aim by providing a probe apparatus, which has one or more probe blocks of the present invention, and a high frequency circuit board and high frequency connectors both connected to the probe blocks. According to the probe block of the present invention, it is possible to place a number of probes in a row with a total space narrower than that is required for placing the same number of the conventional probes in a row. Therefore, according to the probe block of the present invention, it is possible to make coexistence probes suitable for testing high speed signals and other conventional probes not suitable for testing high speed signals in one probe card, by replacing only a part of the probes in a probe card by the probe block of the present invention.

According to the present invention, it is possible to form, using a pair of signal transmitting probes, a balanced transmission line which has advantages that characteristic impedance between balanced signals can be kept almost constant, idealistic coupling states can be maintained, and isolation between neighboring balanced pairs is good. In addition, according to the probe block of the present invention, it is easy to place probe needles in a row parallel to one another in narrow pitch, because a pair of the signal transmitting probes and a ground probe are placed and positioned on the conductive base parallel to one another. Furthermore, according to the probe block of the present invention, it is possible to obtain an advantage that probe needles can be exchanged with new ones by the probe block when any of the probe needles comprised in the probe block is damaged and/or stained, since more than one signal transmitting probes and ground probes are put together in one single probe block. Therefore, according to the probe block of the present invention, the maintenance of the probe needles becomes very easy.

According to a probe card having one or more probe block of the present invention, probes suitable for balanced signals and probes not suitable for balanced signals can coexist in one probe card. Due to this, the probe card of the present invention can be adapted to the test of a semiconductor device in which balanced signals and other signals coexist, as well as to the test of a semiconductor device in which bonding pads for high speed signals and not for high speed signals coexist. This is excellent advantages. Further, the probe apparatus of the present invention having one or more probe blocks of the present invention has advantages that the test of high frequency devices in various kinds can be conducted easily and accurately.

DESCRIPTION OF THE PREFERRED EMBODIMENTS

Hereinafter, the present invention is explained in detail with reference to the accompanying drawings. As a matter of course, the present invention is not limited to the illustrated examples.

Figure 1:
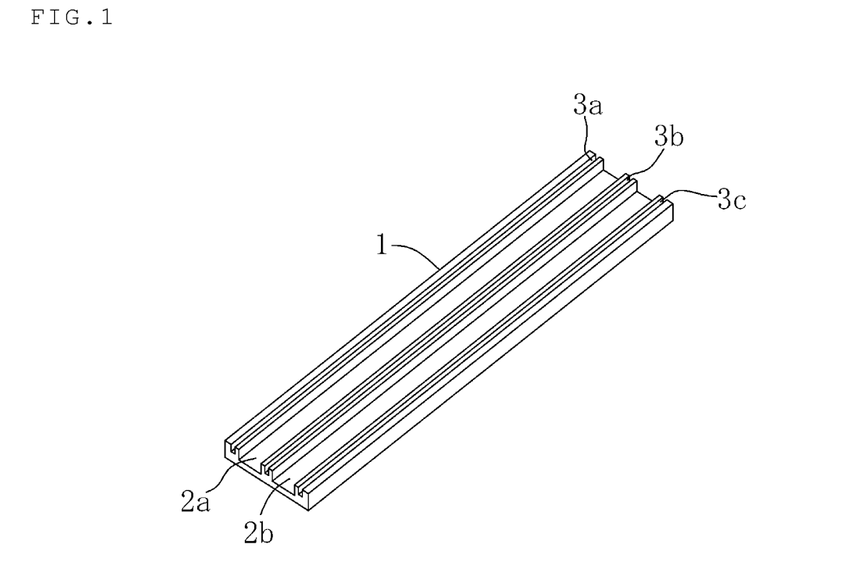
FIG. 1 is a perspective view showing an example the conductive base comprised in the probe block of the present invention.

FIG. 1 is a perspective view showing an example of conductive base in a probe block according to the present invention. In FIG. 1, the reference numeral 1 indicates a conductive base in a probe block according to the present invention. The conductive base 1 is made of conductive material such as, for example, nickel, copper, and aluminium. As shown in FIG. 1, two first grooves 2a and 2b and three second grooves 3a, 3b, and 3c are formed on the conductive base 1. The two first grooves 2a and 2b are same each other in shape and size, and the three second grooves 3a, 3b, and 3c are same one another in shape and size. The first grooves 2a and 2b are parallel to the second grooves 3a, 3b and 3c. In the present embodiment, the shapes and sizes of the first grooves 2a and 2b, and those of the second grooves 3a, 3b and 3c are constant in entire region along the longitudinal direction of the conductive base 1. The first grooves 2a and 2b usually have depth and width both greater than the second grooves 3a, 3b and 3c. This is to place, as explained later, the signal transmitting probes which have dielectric covers and the ground probes which do not have dielectric cover in the first and the second grooves, respectively, so that the signal transmitting probes and the ground probes are same in the height, from the base plane of the conductive base 1, of the center of the probes in cross section perpendicular to the longitudinal direction of the probes. As a matter of course, the number of the first grooves 2a and 2b, as well as the number of the second grooves 3a, 3b and 3c as shown in FIG. 1 are only an example and are not limited to those as illustrated.

Figure 2:
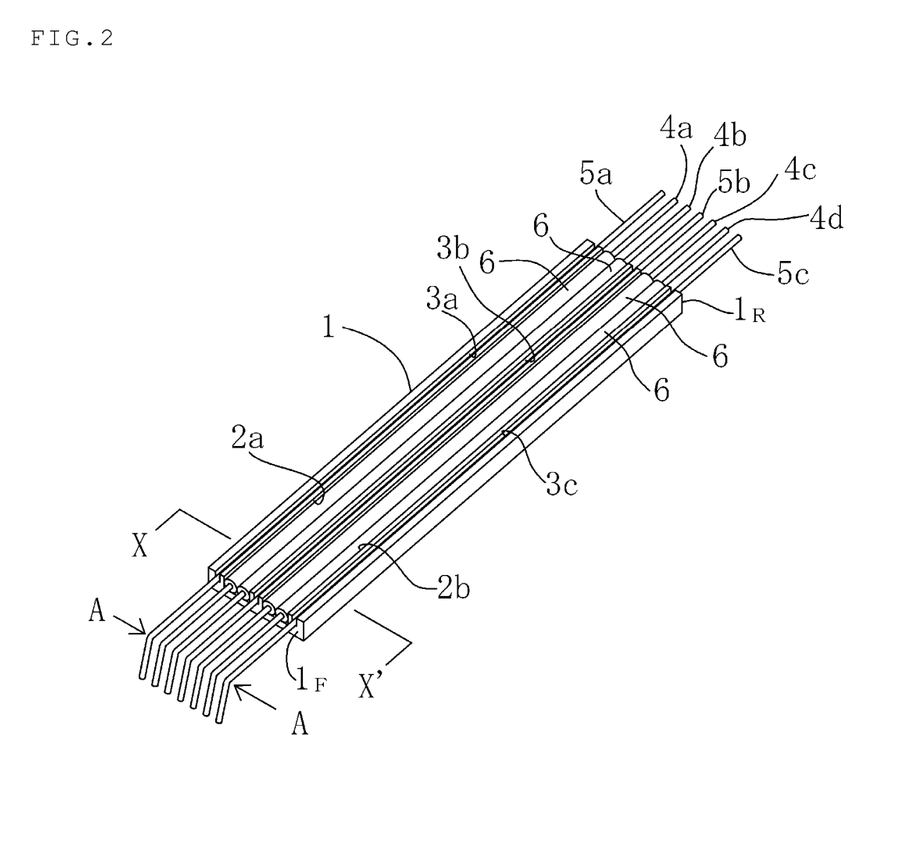
FIG. 2 is a perspective view showing the conductive base on which the ground probes and the signal transmitting probes are placed.

FIG. 2 is a perspective view showing a state where signal transmitting probes and ground probes are placed in the first and the second grooves, respectively, formed on the conductive base 1 shown in FIG. 1. In FIG. 2, the reference numeral $1_F$ indicates a front end of the conductive base 1 located in the side near to a device to be tested. The reference numeral $1_R$ indicates a rear end of the conductive base 1 located in the side near to a circuit board of a probe card or high frequency circuit board. As shown in FIG. 2, two signal transmitting probes 4a and 4b, and two signal transmitting probes 4c and 4d are placed in the first grooves 2a and 2b, respectively, with their dielectric covers being contact with the inside wall of each of the grooves. The ground probes 5a, 5b and 5c are placed in each of the second grooves 3a, 3b and 3c, respectively, with their outer surface being contact with the inside wall of each of the grooves. Since the first grooves 2a and 2b, and the second grooves 3a, 3b and 3c are formed parallel to one another, the signal transmitting probes 4a to 4d and the ground probes 5a to 5c placed in each of the grooves are positioned to be parallel to each other.

The reference numeral 6 indicates a dielectric cover which covers outer surface of the signal transmitting probes 4a to 4d. The signal transmitting probes 4a to 4d are covered with the dielectric covers 6 at least in the part where the signal transmitting probes 4a to 4d are in contact with the conductive base 1. Therefore, the dielectric covers 6 lie between the signal transmitting probes 4a to 4d and the conductive base 1. In this embodiment, the two signal transmitting probes 4a and 4b are placed in the first groove 2a, and the two signal transmitting probes 4c and 4d are placed in the first groove 2b. The signal transmitting probes 4a and 4b, and 4c and 4d compose a balanced pair, respectively, and form a balanced transmission line. Since the two signal transmitting probes 4a and 4b, and 4c and 4d are placed in the first groove 2a and 2b, which are grooves for positioning, respectively, parallel to each other and with their parts covered with the dielectric covers 6 being in contact with each other, it is possible to keep constant the distances between the signal transmitting probe 4a and 4b, and 4c and 4d, each of which compose a balanced pair, and to realize an idealistic coupling state in which characteristic impedance between balanced signals are maintained constant. As the dielectric cover 6, a material having a relative dielectric constant larger than air is preferably selected. For example, fluororesin or polyimide is used as the dielectric cover 6.

On the other hand, the ground probes 5a to 5c are placed in the second grooves 3a to 3c without dielectric covers, and therefore the ground probes 5a to 5c contact with the conductive base 1, thereby they are connected electrically with the conductive base 1. It is sufficient that the ground probes 5a to 5c are in contact with the conductive base 1, and therefore the second grooves 3a to 3c which contain the ground probes 5a to 5c are not necessarily needed. However, it is preferable to form the second grooves 3a to 3c on the conductive base 1 to place the ground probes 5a to 5c in them, because it becomes more easily to fix the ground probes 5a to 5c on the conductive base 1.

As shown in FIG. 2, the front portions of the signal transmitting probes 4a to 4d near to the front end $1_F$ protrude forward from the front end $1_F$ of the conductive base 1. The front portions of the signal transmitting probes 4a to 4d do not have the dielectric covers 6 and are bent downward at the position on the way to their tips, which is indicated by A, to form cantilever type probe needles. The front portions of the ground probes 5a to 5c also protrude forward from the front end $1_F$ of the conductive base 1. The front portions of the ground probes 5a to 5c are also bent downward at the position on the way to their tips, which is indicated by A, to form cantilever type probe needles. All the probes are same in the length of the front portions which protrude from the front end $1_F$ of the conductive base 1, in the position where the front portions are bent, and in bending angle. On the other hand, the rear portions of the signal transmitting probes 4a to 4d and the ground probes 5a to 5c protrude backward from the rear end $1_R$ of the conductive base 1 to form connecting terminals which are connected to a circuit board of a probe card or a high frequency circuit board.

As the signal probes 4a to 4d and the ground probes 5a to 5c, wire rods of conductive and elastic material, such as tungsten-base alloys, are used. The wire rods used as the signal probes 4a to 4d and the ground probes 5a to 5c have circular cross section and are same in their diameter. The portions placed in the first grooves 2a and 2b of the signal transmitting probes 4a to 4d appear to be larger in diameter than the ground probes 5a to 5c, because the portions have the dielectric covers 6.

In the embodiment, the ground probes 5a to 5c exist in the full length of the second grooves 3a to 3c formed on the conductive base 1 and protrude from the rear end $1_R$ as well as from the front end $1_F$. The ground probes 5a to 5c, however, do not necessarily exist in the full length of the second grooves 3a to 3c, because the ground probes 5a to 5c are in contact with the conductive base 1 electrically. It is enough that the ground probes 5a to 5c have at least the portions which protrude from the front end $1_F$ to form probe needles and the portions which are placed in the second grooves 3a to 3c to be in contact with the conductive base 1. When the ground probes 5a to 5c do not have the portions which protrude from the rear end $1_R$ of the conductive base 1, any appropriate conductive materials can be used as connecting terminals by electrically connecting them to the conductive base 1 or a cover plate, which is explained later.

Figure 3:
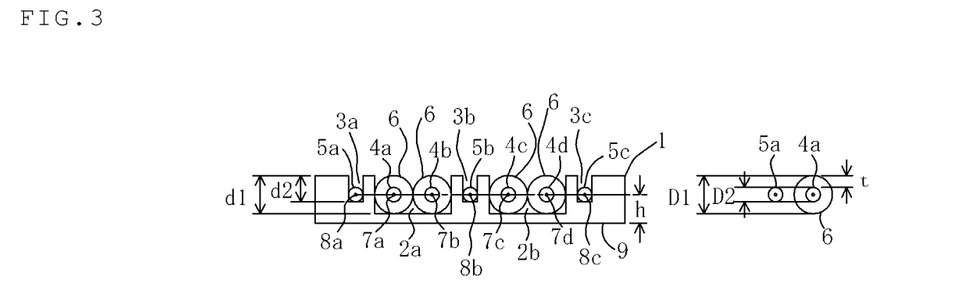
FIG. 3 is X-X' cross section of FIG. 2.

FIG. 3 is X-X' cross section of FIG. 2. For the sake of convenience, only the signal transmitting probe 4a and the ground probe 5a are picked up and illustrated in the right side of FIG. 3. In FIG. 3, the reference numerals 7a, 7b, 7c and 7d indicate the center of the signal transmitting probes 4a, 4b, 4c and 4d, respectively, in a cross section perpendicular to the longitudinal direction of the signal transmitting probes 4a to 4d. The reference numerals 8a, 8b and 8c indicate the center of the ground probes 5a, 5b and 5c, respectively, in a cross section perpendicular to the longitudinal direction of the ground probes 5a to 5c. The reference numeral 9 indicates the base plane of the conductive base 1.

As shown in FIG. 3, the ground probes 5a to 5c are placed in the second grooves 3a to 3c, respectively, with their outer surfaces being in contact with the inside walls and the base planes of the second grooves 3a to 3c. Thus, the ground probes 5a to 5c are positioned straight and parallel to one another. The signal transmitting probes 4a and 4b, and 4c and 4d are placed in the first grooves 2a and 2b to form a balanced pair, respectively, with their dielectric covers 6 being contact with each other. The outer surfaces of the dielectric covers 6 of the signal transmitting probes 4a to 4d are in contact with the inside walls and the base planes of the first grooves 2a and 2b. Thus, the signal transmitting probes 4a and 4b, and 4c and 4d are positioned straight and parallel to each other.

The reference numeral $d_1$ indicates the depth of the first grooves 2a and 2b. The depth of the first groove 2a is same as the depth of the first groove 2b, which are both $d_1$. The reference numeral $d_2$ indicates the depth of the second grooves 3a to 3c. All of the second grooves 3a to 3c have the same depth $d_2$. The depth $d_1$ of the first grooves 2a and 2b are greater than the depth $d_2$ of the second grooves 3a to 3c. The relationship between the depth $d_1$ and $d_2$ is so determined that the signal transmitting probes 4a to 4d and the ground probes 5a to 5c are all same in the distance h from the base plane 9 of the conductive base 1 to each of the centers 7a to 7d and 8a to 8c of the probes. In this embodiment, as shown in the right side of FIG. 3, the signal transmitting probes 4a to 4d and the ground probes 5a to 5c are all made of wire rod having circular cross section and diameter $D_2$. Since the signal transmitting probes 4a to 4d have the dielectric covers 6 of the thickness t around their outer surfaces, the depth $d_1$ of the first grooves 2a and 2b are greater than the depth $d_2$ of the second grooves 3a to 3c by the thickness t of the dielectric cover 6, and the depth $d_1$, $d_2$ and the thickness t satisfy the following relationship; $d_1=d_2+t$.

In this embodiment, the depth $d_1$ and $d_2$ are constant from the front end $1_F$ to the rear end $1_R$ of the conductive base 1. Therefore, the distances h from the base plane 9 of the conductive base 1 to each of the centers 7a to 7d and 8a to 8c of the probes are same for all the probes in full region along the longitudinal direction of the conductive base 1. While it is preferable that all the probes have the same distances h in full regions along the longitudinal direction of the conductive base 1, it is sufficient that all the probes have the same distance h at least at the front end $1_F$ of the conductive base 1.

In the embodiment, the depth $d_1$ of the first grooves 2a and 2b are set so that the top of the signal transmitting probes 4a to 4d, including the dielectric covers 6, be even with the upper surface of the conductive base 1 when they are placed in the first grooves 2a and 2b. Consequently, when $D_1$ represents the outside diameter of the signal transmitting probes 4a to 4d including the thickness t of the dielectric cover 6, the depth $d_1$ is equal to the outside diameter $D_1$, and $D_1$ is equal to the sum of the diameter $D_2$ of the signal transmitting probes 4a to 4d and two times of the thickness t of the dielectric cover 6. In other words, the relationship between $D_1$ $D_2$ and t is represented by the following formula; $D_1=D_2+2t$.

Figure 4:
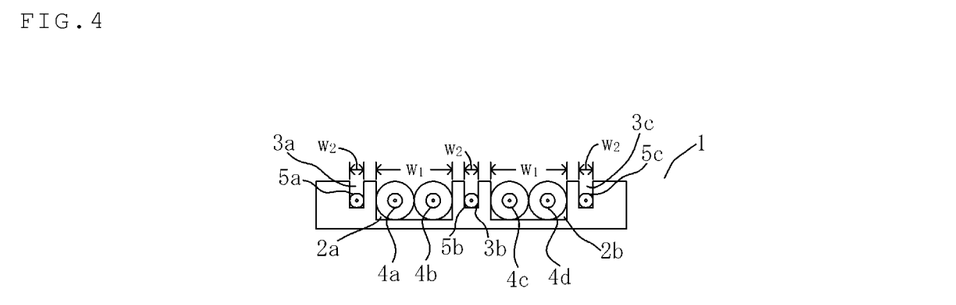
FIG. 4 is X-X' cross section of FIG. 2.

FIG. 4 is X-X' cross section of FIG. 2 similar to FIG. 3. In FIG. 4, $w_1$ indicates the width of the first grooves 2a and 2b, and $w_2$ indicates the width of the second grooves 3a to 3c. The width $w_2$ of the second grooves 3a to 3c is set to be equal to the diameter $D_2$ of the ground probes 5a to 5c. Consequently, when the ground probes 5a, 5b and 5c are placed in the second grooves 3a, 3b and 3c, respectively, the outer surface of the ground probes 5a, 5b and 5c come into contact with the inside wall and base plane of the second grooves 3a, 3b and 3c, respectively, thereby the ground probes 5a to 5c are positioned at the prescribed place in the grooves. The width $w_1$ of the first grooves 2a and 2b is set to be two times of the outside diameter $D_1$, which includes the thickness of the dielectric cover 6, in other words, to satisfy the equation $w_1=2D_1$, so that two signal transmitting probes are placed in each of the first grooves 2a and 2b.

Figure 5:
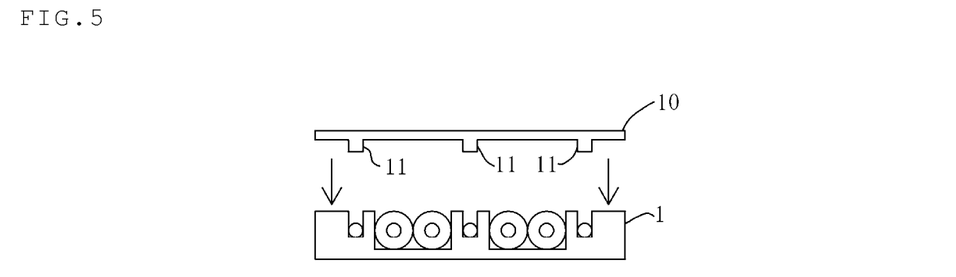
FIG. 5 is a cross section showing how to attach the cover plate to the conductive base.

FIG. 5 is a cross section showing how to attach a cover plate on the conductive base 1 to cover the upper surfaces of the probes placed in the first and second grooves. In FIG. 5, the reference numeral 10 indicates a cover plate. The cover plate 10 has more than one protrusion 11. The protrusions 11 preferably exist in full length of the cover plate 10 along its longitudinal direction. However, it is not necessary for the protrusions 11 to exist continuously in full length of the cover plate 10 along its longitudinal direction. The protrusions 11 may exist intermittently along the longitudinal direction of the cover plate 10. The cover plate 10 is made of conductive materials, such as copper, nickel, and aluminium. There are no limitations on the means for attaching the cover plate 10 to the conductive base 1. The cover plate 10 can be attached to the conductive base 1 by any means as long as the cover plate 10 is able to cover the upper surfaces of the signal transmitting probes 4a to 4d placed in the first grooves 2a and 2b and to shield the upper surfaces. For example, when the cover plate 10 is made of a conductive material which is different in hardness from a conductive material which forms the conductive base 1, the cover plate 10 can be attached to the conductive base 1 by pressing them into each other at appropriate positions to attach the cover plate 10 to the conductive base 1 by press.

Figure 6:
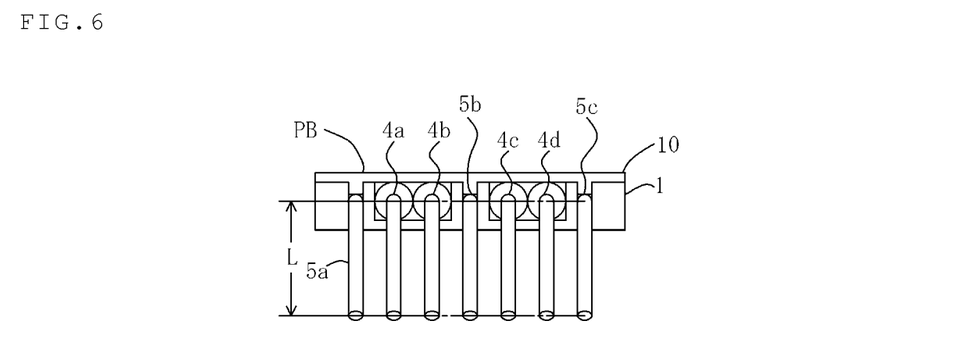
FIG. 6 is a front view of the conductive base on which the cover plate is attached.
Figure 7:
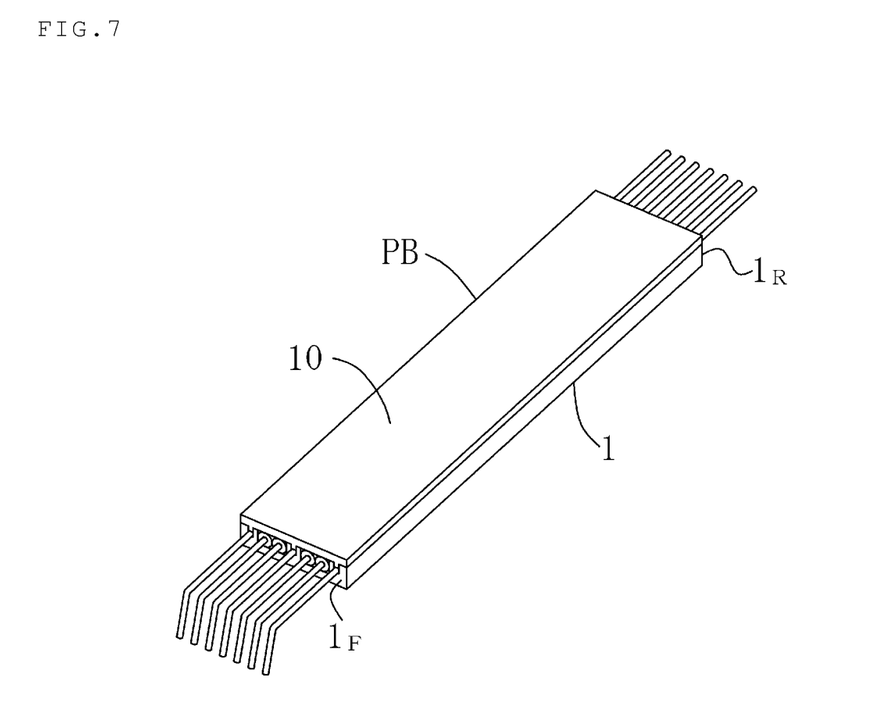
FIG. 7 is a perspective view showing an example of the probe block of the present invention.

FIG. 6 is a front view of the front end $1_F$ side of a probe block PB of the present invention, in which the cover plate 10 is attached to the conductive base 1. FIG. 7 is a perspective view of the probe block PB of the present invention. As shown in FIG. 6, the upper surfaces of the signal transmitting probes 4a to 4d placed in the first grooves 2a and 2b are covered by the cover plate 10 attached to the conductive base 1. Since the upper surfaces, as well as the side and the base surfaces, of the signal transmitting probes 4a to 4d are shielded, more perfect transmission structure is realized.

As shown in FIG. 6 and FIG. 7, the front portions of the signal transmitting probes 4a to 4d and the ground probes 5a to 5c protrude forward from the front end $1_F$ of the conductive base 1 and are bent downward at the position on the way to their tips to form cantilever type probe needles. The signal transmitting probes 4a to 4d and the ground probes 5a to 5c are all same in the length of their front portions which protrude forward from the front end $1_F$ of the conductive base 1, and are also same in the length L, which is the length of the parts bent downward. In the embodiment, the front portions of the signal transmitting probes 4a to 4d and the ground probes 5a to 5c protrude forward parallel to one another. Therefore, the distance between the centers of the each neighboring probe needles is same as the distance between the centers of the each neighboring probes at the position of the front end $1_F$.

As explained above, in the probe block PB of the present invention, two pairs of the signal transmitting probes 4a and 4b, and 4c and 4d, each of which forms balanced transmission line, are placed in the first grooves 2a and 2b, respectively, parallel to each other and with their portions covered by the dielectric covers 6 being in contact with each other. Consequently, characteristic impedances between the balanced signals are kept almost constant in the probe block PB, and an idealistic coupling state is realized, thereby superior signal transmission characteristics are obtained. Furthermore, in the probe block PB of the present invention, the signal transmitting probes 4a and 4b, which form a balanced pair, are separated from the signal transmitting probes 4c and 4d, which form another balanced pair, by the conductive base 1. Due to this, the probe block PB of the present invention has advantages that isolation between the balanced pairs is quite good and excellent transmission characteristics are achieved. The signal transmitting probes 4a and 4b, which form a balanced pair, can be separated from the signal transmitting probes 4c and 4d, which form another balanced pair, by the conductive cover plate 10, or by both of the conductive cover plate 10 and the conductive base 1, instead of the conductive base 1, In the probe block PB of the present invention, the signal transmitting probes 4a to 4d and the ground probes 5a to 5c are contained between the conductive base 1 and the conductive cover plate 10 in the state being positioned exactly parallel to one another. It is therefore easy in the probe block PB of the present invention to make short the distance between each probes, and thereby to make narrow the pitches of the probes, which are advantages of the present invention. Further, since the signal transmitting probes 4a to 4d and the ground probes 5a to 5c are same in the length of the front portions which protrude forward from the front end $1_F$ of the conductive base 1 to form probe needles, it is easy to make the probes to have the same transmission characteristics, and thereby to realize excellent high frequency response characteristics, which are advantages of the present invention.

Figure 8:
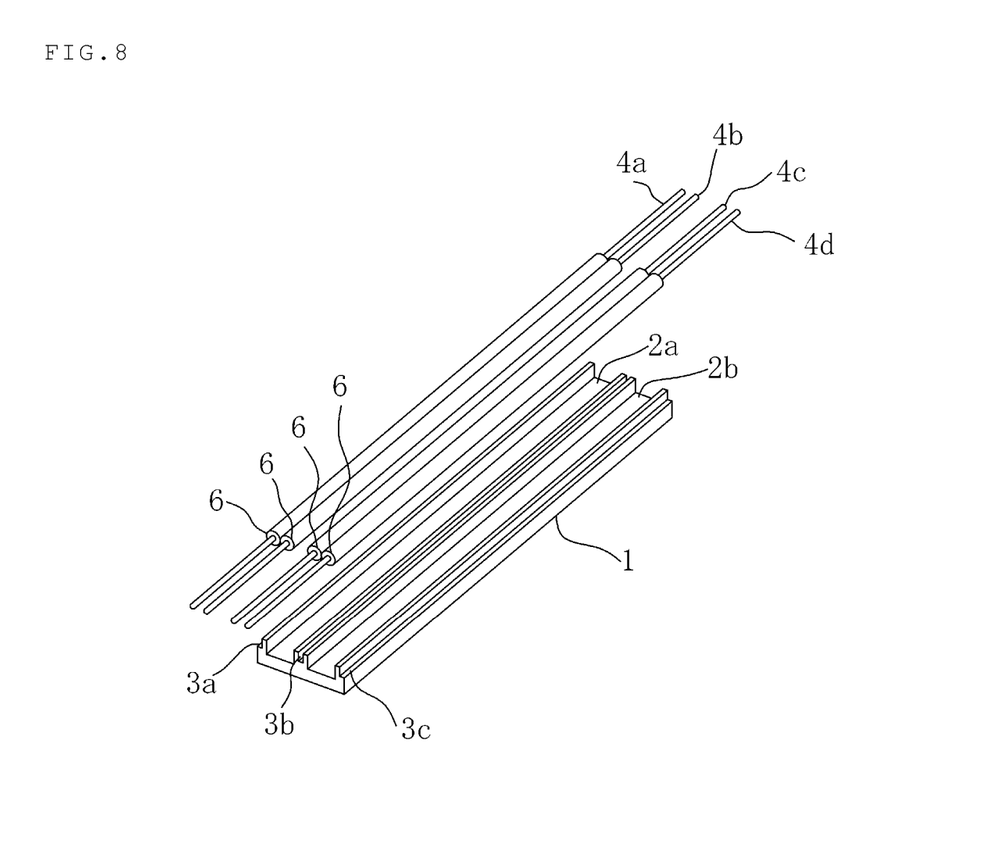
FIG. 8 is a perspective view showing another example of the probe block of the present invention.
Figure 9:
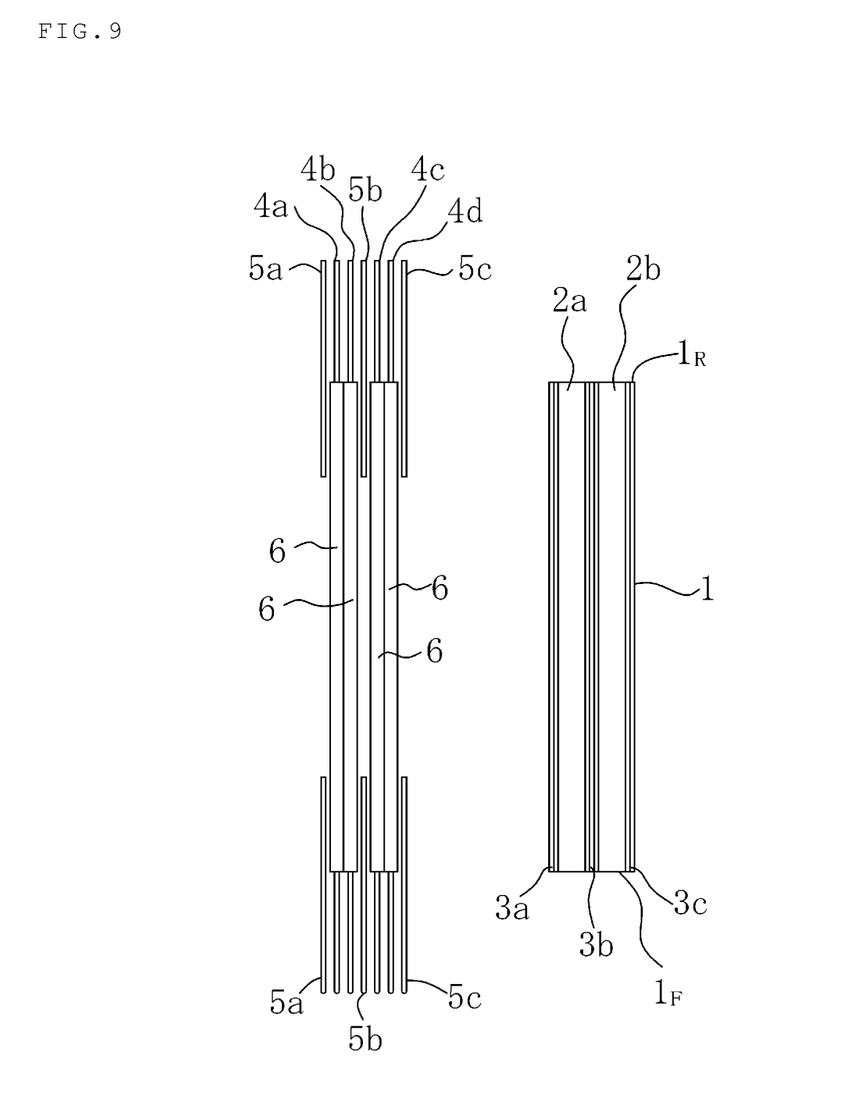
FIG. 9 is a plan view showing another example of the probe block of the present invention.

FIG. 8 is a perspective view of another example of the probe block of the present invention. In FIG. 8, only the conductive base 1 and the signal transmitting probes 4a to 4d are shown. FIG. 9 is a plan view of the probe block of the present invention as shown in FIG. 8. In FIG. 9, only the conductive base 1, the signal transmitting probes 4a to 4d, and the ground probes 5a to 5c are shown. In the embodiment, the second grooves 3a and 3c are not a perfect groove surrounded its both sides with the conductive base 1, but a half groove having the conductive base 1 as a side wall at one side and being open at another side. Further, the ground probes 5a to 5c exist only in the vicinity of the front end $1_F$ and the rear end $1_R$, as well as in the portions protruding forward or backward from each of the ends, and do not exist in the center area of the conductive base 1, because it is sufficient for the ground probes 5a to 5c to be in contact with the conductive base 1 at least a part thereof.

Figure 10:
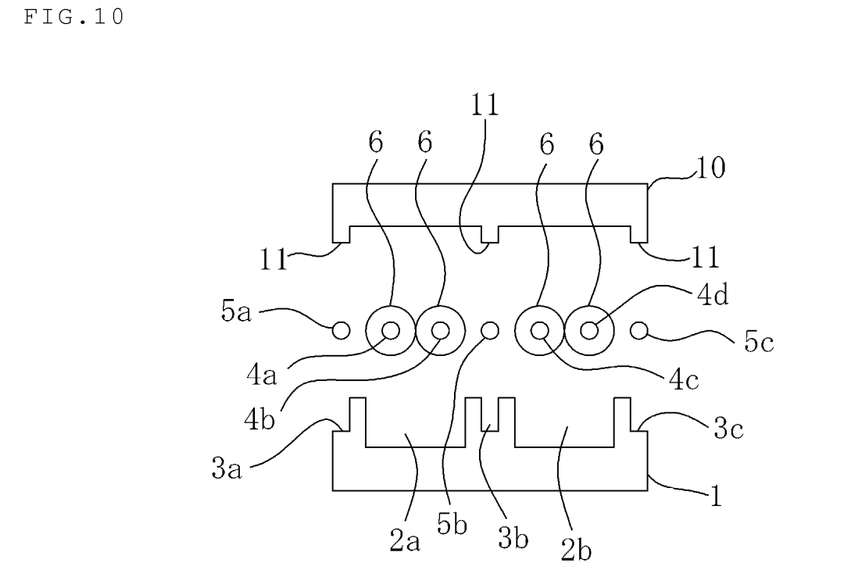
FIG. 10 is a cross section showing how to assemble the probe block of the present invention.
Figure 11:
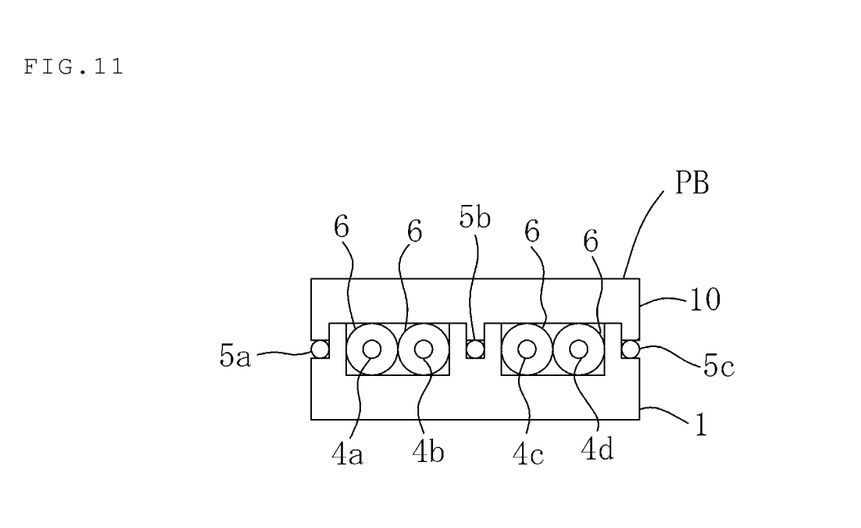
FIG. 11 is a cross section of the probe block thus assembled.

FIG. 10 is a cross section, showing how to assemble the probe block as shown in FIGS. 8 and 9. FIG. 11 is a cross section of the probe block thus assembled. As shown in FIG. 10 and FIG. 11, the probe block PB of the present embodiment, similar to the probe block PB in the embodiment explained above, is assembled by placing the signal transmitting probes 4a to 4d and the ground probes 5a to 5c in the first grooves 2a, 2b and the second grooves 3a to 3c, respectively, and by covering their upper surfaces with the conductive cover plate 10. The ground probes 5a and 5c located in the outer sides are compressed vertically by the conductive base 1 and the conductive cover plate 10 with their one side being in contact with the inside wall of the second groove 3a or 3c, and therefore, the ground probes 5a and 5c are placed and positioned in the second grooves 3a and 3c, respectively, without undesirable displacement.

In another embodiment, the conductive cover plate 10 may have other protrusions at the positions outer than the protrusions 11 located in outer sides of the cover plate 10. The other protrusions protrude downward with the length greater than the protrusions 11, and form outside wall of the second grooves 3a and 3c.

Figure 12:
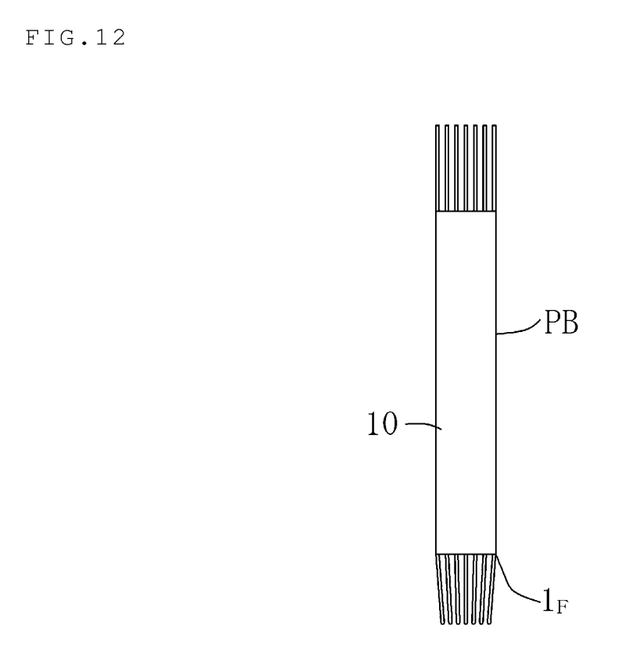
FIG. 12 is a plan view showing the probe block of the present invention adapted to a device to be tested which has relatively narrow bonding pad pitch.
Figure 13:
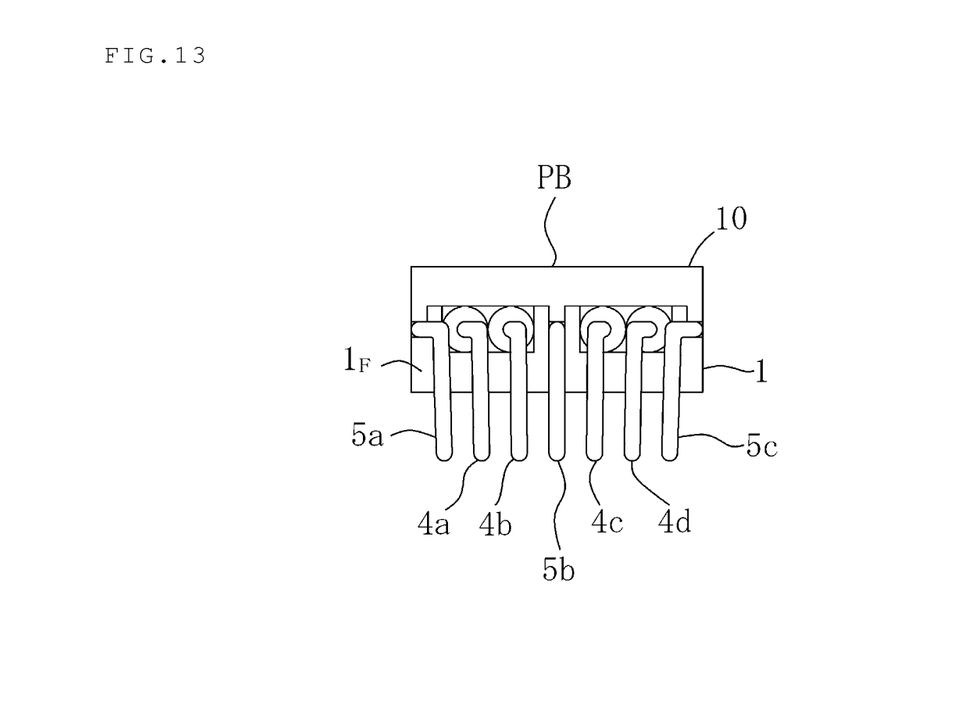
FIG. 13 is an enlarged front view of FIG. 12.

FIG. 12 is a plan view, and FIG. 13 is an enlarged front view of the probe block PB of the present invention as shown in FIGS. 8 to 11. Both of FIG. 12 and FIG. 13 show the state in which the probe block PB of the present invention is adapted to a device under test having bonding pads located in relatively narrow pitch. As shown in FIG. 12 and FIG. 13, the front portions of the signal transmitting probes 4a to 4d and the ground probes 5a to 5c, which protrude forward from the front end $1_F$ of the conductive base 1 and form the probe needles, are bent inward with respect to the signal transmitting probes 4a to 4d and the ground probes 5a to 5c existing inside of the conductive base 1, and the spaces between their tips are made narrower than those between their centers at the front end $1_F$ to form anti-fan-shape in a view from the conductive base 1.

Figure 14:
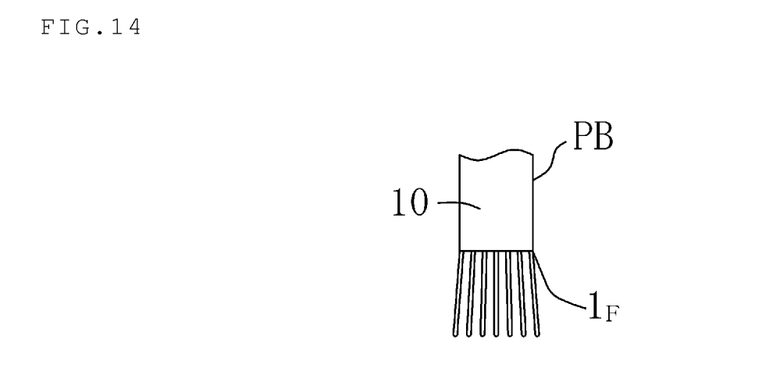
FIG. 14 is a partial plan view showing the probe block of the present invention adapted to a device to be tested which has relatively wide bonding pad pitch.
Figure 15:
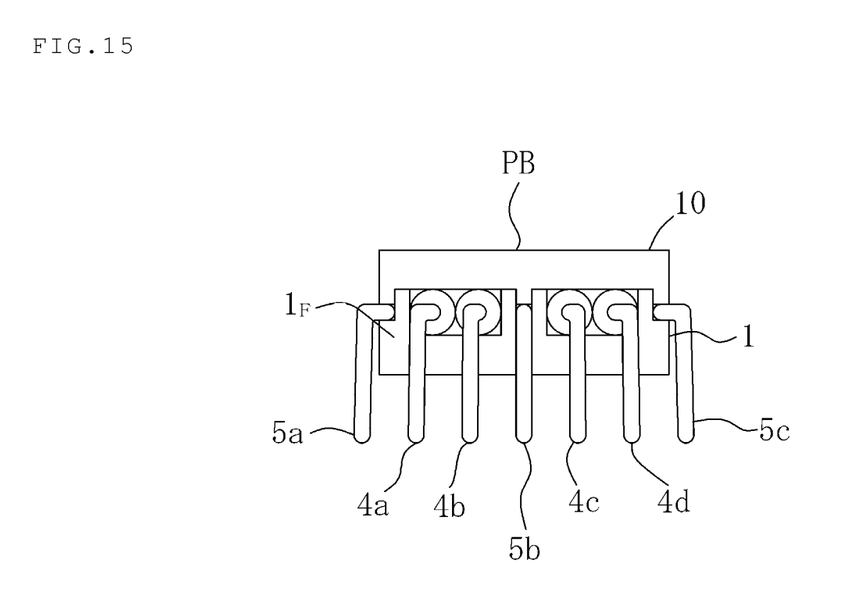
FIG. 15 is an enlarged front view of FIG. 14.

FIG. 14 is a partial plan view, and FIG. 15 is an enlarged front view of the probe block PB of the present invention as shown in FIGS. 8 to 11. Both of FIG. 14 and FIG. 15 show the state in which the probe block PB of the present invention is adapted to a device under test having bonding pads located in relatively wide pitch. As shown in FIG. 14 and FIG. 15, the front portions of the signal transmitting probes 4a to 4d and the ground probes 5a to 5c, which protrude forward from the front end $1_F$ of the conductive base 1 and form the probe needles, are bent outward with respect to the signal transmitting probes 4a to 4d and the ground probes 5a to 5c existing inside of the conductive base 1, and the spaces between their tips are made wider than those between their centers at the at the front end $1_F$ to form fan-shape in a view from the conductive base 1.

As explained above, the probe block PB of the present invention can be adapted to a device under test which has pitch of bonding pads either narrower or wider than the pitch of the probes at the position of the front end $1_F$ of the probe block PB, by bending the front portions of the signal transmitting probes 4a to 4d and the ground probes 5a to 5c, which protrude forward from the front end $1_F$ of the conductive base 1, either inward or outward with respect to the signal transmitting probes 4a to 4d and the ground probes 5a to 5c existing inside of the conductive base 1 to make narrower or wider the spaces between their tips which form the probe needles in either anti-fan-shape or fan-shape in a view from the conductive base 1. When the spaces between bonding pads in a device under test are not uniform, the front portions of the signal transmitting probes 4a to 4d and the ground probes 5a to 5c can be bent not uniformly to form anti-fan-shape or fan-shape, but individually in different bending angles with respect to the probes existing inside of the conductive base 1 in accordance with the spaces between the bonding pads and their arrangement in the device to be tested. Needless to say, it is not necessary to bend the front portions of the probes at all when the spaces between the centers of the probes at the position of the front end $1_F$ of the conductive base 1 coincide with the pitch of the bonding pads in a device to be tested.

In the embodiments as above explained, the probe block of the present invention has two pairs of signal transmitting probes and three ground probes, and each of the pairs is located between the ground probes. In other words, when "S" represents a signal transmitting probe and "G" represents a ground probe, then the conformation of the probe block of the present invention as above explained is represented by the following series of symbols; "GSSGSSG". The conformation of the signal transmitting probes and the ground probes in the probe block according to the present invention, however, is not limited to "GSSGSSG". The probe block of the present invention may have a conformation, for example, represented by "GSS SSG". Such conformation can be obtained by positioning two pairs of the signal transmitting probes, each of which forms a balanced pair, between two ground probes and separating the two pairs by the conductive base 1 and/or the conductive cover plate 10. Furthermore, the probe block of the present invention may have a conformation represented by "GSSGSGSSG", which comprises two pairs of signal transmitting probes which form a balanced pair, respectively, and a signal transmitting probe which does not form a balanced pair.

In the above explanation, cantilever type probe is referred to as an example. However, the probes used in the probe block of the present invention are not limited to the cantilever type. For example, vertical type probes or MEMS (Micro Electro Mechanical Systems) type probes are of course used in the probe block of the present invention.

Figure 16:
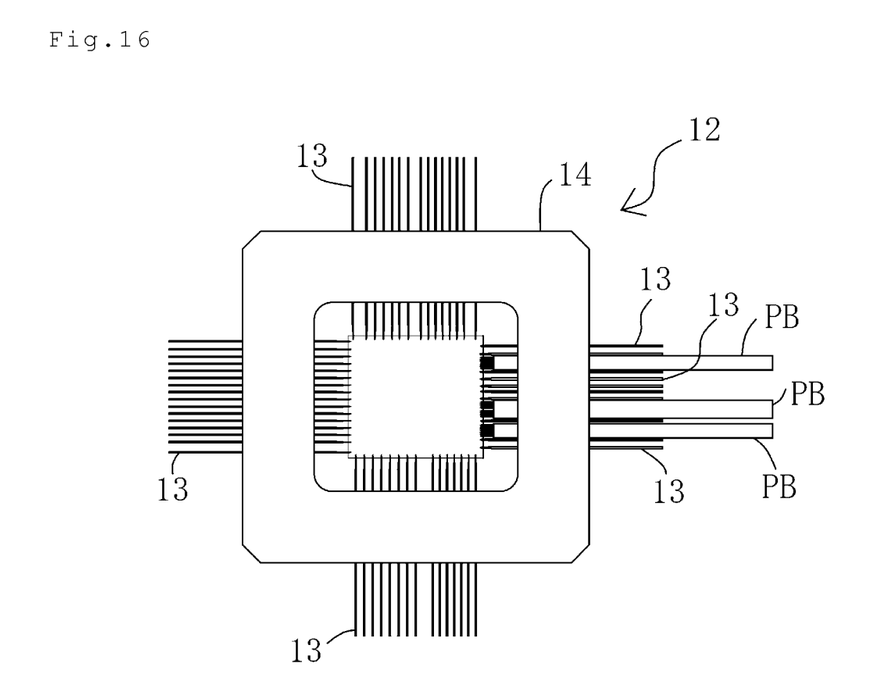
FIG. 16 is a plane view showing an example of probe area in the probe card having the probe blocks of the present invention.

FIG. 16 is a plan view of a probe area of a probe card having a probe block PB according to the present invention. In FIG. 16, the reference numeral 12 indicates a probe card which has probe blocks PB of the present invention. The reference numeral 13 indicates probes attached to the probe card 12, and the reference numeral 14 indicates probe fixing board. As shown in FIG. 16, the probe card 12 of this embodiment has three probe blocks PB of the present invention in the row of probes aligned on a side facing a device under test. According to the present invention, it is possible to replace only a part of probes 13 facing the device under test by the probe block PB of the present invention, because the width of the conductive base 1 of the probe block PB of the present invention is usually shorter than the width of the row of probes on one side of the probe card 12 facing the device under test. Needless to say, the number of the probe blocks PB of the present invention equipped in one probe card 12 is not limited to three, and the row of probes 13 in which a part of the probes is replaced by the probe block PB of the present invention is not limited to the that in one side of the probe card 12 facing the device under test.

As explained above, according to the probe card having one or more probe blocks PB of the present invention, it is possible to coexist in one probe card the probes which compose the probe block PB of the present invention and are suitable for transmitting balanced signal, and other ordinary probes 13 which are not so suitable for transmitting balanced signal. Consequently, according to the present invention, the probe card 12 can be used for testing a semiconductor device in which balanced signals and other signals coexist, when a part of the probes 13 of the probe card 12 are replaced by one or more probe blocks PB of the present invention. Further, it is possible to place a large number of the probe needles in a row facing same direction, because a large number of the probes can be set on the probe card 12 in narrow pitch when one or more probe blocks PB of the present invention are used. Due to this, the probe card 12 having one or more probe blocks PB of the present invention has advantages that the production of the probe card 12, as well as the design for the arrangement of probe needles, become much easier. In addition, in the probe card 12 having one or more probe blocks PB of the present invention, when one or more probes composing a probe block PB have to be replaced by new ones because of any damages and/or stains suffered by them, one or more probe blocks PB which comprise such damaged and/or stained probes can be replaced as a whole by new ones, by the probe block. Therefore, the maintenance of a probe card is very easy when it has one or more probe blocks PB of the present invention.

Furthermore, while it is not shown in Figures, the probe block PB of the present invention can be used not only as probes which compose the probe card 12, but also as an independent probe apparatus by itself, by connecting a high frequency circuit board and high frequency connectors with the probe block PB of the present invention.

Example 1

A probe block having a conformation represented by "GSSGSSG" and probe pitch of 110 μm was prepared using the following materials, and its transmission characteristics were measured and compared with those of the following conventional coaxial cable.

<Probe Block of the Present Invention>
<Signal Transmitting Probe>
   Probe material: tungsten-base alloy (diameter is 0.038 mm)
   Probe length: 25 mm
   Length of the front portion: 1.0 mm
   Dielectric cover: fluororesin (outside diameter is 0.11 mm)
<Ground Probe>
   Probe material: tungsten-base alloy (diameter is 0.038 mm)
   Probe length: 25 mm
   Length of the front portion: 1.0 mm
<Coaxial Cable as a Control>
   Probe material: tungsten-base alloy (diameter is 0.13 mm)
   Probe length: 25 mm
   Length of the front portion: 3.2 to 3.7 mm
   Dielectric cover: fluororesin (outside diameter is 0.42 mm)
<Measurement of Transmission Characteristics>
   Insertion loss (S21) was measured using the following measuring apparatus and in accordance with the following procedures.
   Measuring apparatus: Network Analyzer (produced by Agilent Technologies, U.S.A. Type: E8364B (-50 GHz Network Analyzer)
   Measuring procedures: Insertion loss (S21) between the tip and the rear end of one signal transmitting probe (S) which composes the produced probe block of the present invention was measured. In the same way, insertion loss (S21) between the front end and the rear end of the conventional coaxial cable was measured.

Figure 17:
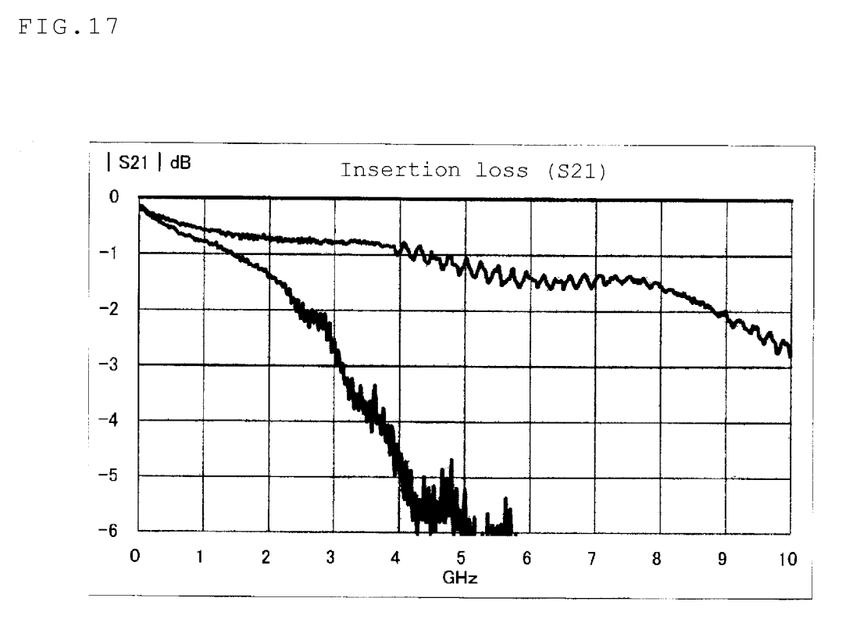
FIG. 17 is a graph showing transmission characteristics.

The results are shown in FIG. 17. As shown in FIG. 17, in the conventional coaxial cable, the insertion loss became larger with the increase of the signal frequency, and exceeded -3 dB when the signal frequency was beyond 3 GHz. This means that about half of the signal energy has lost as transmission loss. Contrary to this, in the probe block of the present invention, the insertion loss did not exceed -1 dB even when the signal frequency reached 4 GHz, and was less than -3 dB even at the signal frequency of 10 GHz. The results indicate that the probe block of the present invention is much superior to the conventional coaxial cable in high frequency transmission characteristics.

INDUSTRIAL APPLICABILITY

As explained above, according to the probe block of the present invention, the probe card having the probe block of the present invention, and the probe apparatus having the probe block of the present invention, characteristic test of a high frequency device can be conducted more accurately and easier. Furthermore, since the probe block of the present invention makes it possible to replace probes by new ones by the probe block, the maintenance of the probe card and the probe apparatus of the present invention are very easy. The present invention makes it possible to conduct easily and accurately the characteristic tests which are indispensable for producing high frequency devices such as semiconductor devices for high frequency. The present invention bears great industrial applicability.

What is claimed is:

1. A probe block, which comprises
   1) a conductive base on which a first groove is formed,
   2) a pair of signal transmitting probes having dielectric covers and placed parallel to each other in the same one first groove with their dielectric covers being in contact with each other without the conductive base between them to form a balanced transmission line, and
   3) a ground probe which is in contact with the conductive base,
   wherein the first groove has a width equal to two times of the outside diameter of the signal transmitting probe including the thickness of the dielectric cover, and
   wherein front portions of the signal transmitting probes are bare of the dielectric covers and protrude from the conductive base toward a device under test to form signal transmitting probe needles, and a front portion of the ground probe protrudes from the conductive base toward the device under test to form a ground probe needle.

2. The probe block according to claim 1, which has a conductive cover plate which covers the upper surfaces of the pair of the signal transmitting probes placed in the first groove.

3. The probe block according to claim 1, wherein a second groove is formed on the conductive base, and the ground probe is placed in the second groove.

4. The probe block according to claim 3, wherein the depth of the first groove is greater than that of the second groove, and the relationship between the depth of the first groove and the depth of the second groove is so determined that the distances from the base plane of the conductive base to the centers of the signal transmitting probes in a cross section vertical to longitudinal direction of the conductive base are equal to the distance from the base plane of the conductive base to the center of the ground probe in a cross section vertical to longitudinal direction of the conductive base, at least at the front end of the conductive base near to the device under test, and the signal transmitting probes and the ground probe have a length equal to the length of the front portions which protrude from the conductive base toward the device under test.

5. The probe block according to claim 1, wherein more than one first grooves are formed on the conductive base, and the two signal transmitting probes which make a pair are placed in each of the first grooves parallel to each other and with their dielectric covers being in contact with each other, and the pairs of the signal transmitting probes are separated by the conductive base and/or the conductive cover plate.

6. The probe block according to claim 1, wherein the front portions of the signal transmitting probes and the ground probes which protrude from the conductive base toward the device under test are bent with respect to the portions of the signal transmitting probes and the ground probes existing inside of the conductive base to adapt to a device to be tested having a bonding pad pitch different from the pitch of the signal transmitting probes and the ground probes existing inside of the conductive base.

7. A probe card, which has one or more probe blocks according to claim 1.

8. A probe apparatus, which has one or more probe blocks according to claim 1, and a high frequency circuit board and high frequency connectors both connected to the probe blocks.

9. The probe block according to claim 2, wherein a second groove is formed on the conductive base, and the ground probe is placed in the second groove.

10. The probe block according to claim 9, wherein the depth of the first groove is greater than that of the second groove, and the signal transmitting probes and the ground probe are same in the height of their centers in a cross section vertical to longitudinal direction of the conductive base from the base plane of the conductive base at least at the front end of the conductive base near to the device under test, and in the length of the front portions which protrude from the conductive base toward the device under test.

11. The probe block according to claim 2, wherein more than one first grooves are formed on the conductive base, and the two signal transmitting probes which make a pair are placed in each of the first grooves parallel to each other and with their dielectric covers being in contact with each other, and the pairs of the signal transmitting probes are separated by the conductive base and/or the conductive cover plate.

12. The probe block according to claim 2, wherein the front portions of the signal transmitting probes and the ground probes which protrude from the conductive base toward the device under test are bent with respect to the portions of the signal transmitting probes and the ground probes existing inside of the conductive base to adapt to a device to be tested having a bonding pad pitch different from the pitch of the signal transmitting probes and the ground probes existing inside of the conductive base.

13. A probe card, which has one or more probe blocks according to claim 2.

14. A probe apparatus, which has one or more probe blocks according to claim 2, and a high frequency circuit board and high frequency connectors both connected to the probe blocks.

* * * * *